United States Patent
Bakker et al.

(10) Patent No.: US 7,116,394 B2
(45) Date of Patent: Oct. 3, 2006

(54) METHOD FOR CLEANING A SURFACE OF A COMPONENT OF A LITHOGRAPHIC PROJECTION APPARATUS, LITHOGRAPHIC PROJECTION APPARATUS, DEVICE MANUFACTURING METHOD AND CLEANING SYSTEM

(75) Inventors: Levinus Pieter Bakker, Helmond (NL); Ralph Kurt, Eindhoven (NL); Bastiaan Matthias Mertens, Den Haag (NL); Markus Weiss, Aalen (DE); Johann Trenkler, Schwaebisch Gmuend (DE); Wolfgang Singer, Aalen (DE)

(73) Assignees: ASML Netherlands B.V., Veldhoven (NL); Carl Zeiss SMT AG, Oberkochen (DE)

( * ) Notice: Subject to any disclaimer, the term of this patent is extended or adjusted under 35 U.S.C. 154(b) by 105 days.

(21) Appl. No.: 10/738,976

(22) Filed: Dec. 19, 2003

(65) Prior Publication Data

US 2004/0218157 A1 Nov. 4, 2004

(30) Foreign Application Priority Data

Dec. 20, 2002 (DE) .................. 102 61 875
Dec. 24, 2002 (EP) .................. 02080488

(51) Int. Cl.
 *G03B 27/52* (2006.01)
 *G03B 27/42* (2006.01)

(52) U.S. Cl. ......................... 355/30; 355/53

(58) Field of Classification Search ............ 355/30, 355/53, 67, 69; 356/237; 250/492.2, 492.22; 134/1.1–1.3
See application file for complete search history.

(56) References Cited

U.S. PATENT DOCUMENTS

| | | | |
|---|---|---|---|
| 4,665,315 A * | 5/1987 | Bacchetti et al. | 250/492.1 |
| 5,217,510 A | 6/1993 | Logan et al. | |
| 5,401,356 A * | 3/1995 | Enami et al. | 438/5 |
| 5,401,974 A * | 3/1995 | Oae et al. | 250/492.2 |
| 5,531,862 A * | 7/1996 | Otsubo et al. | 438/798 |
| 6,033,484 A | 3/2000 | Mahoney | |
| 6,192,897 B1 | 2/2001 | Klebanoff et al. | |
| 6,268,904 B1 * | 7/2001 | Mori et al. | 355/53 |
| 6,614,505 B1 * | 9/2003 | Koster et al. | 355/30 |
| 6,642,531 B1 | 11/2003 | Powers | |
| 6,781,673 B1 * | 8/2004 | Moors et al. | 355/76 |
| 2002/0053353 A1 | 5/2002 | Kawata et al. | |
| 2002/0123161 A1 | 9/2002 | Ushiki et al. | |
| 2003/0051739 A1 | 3/2003 | Klebanoff et al. | |

OTHER PUBLICATIONS

European Search Reported dated Nov. 25, 2003.
A copy of European Search Reported dated Mar. 12, 2004 for EP Application No. 03079145.3.

* cited by examiner

*Primary Examiner*—Henry Hung Nguyen
(74) *Attorney, Agent, or Firm*—Pillsbury Winthrop Shaw Pittman LLP

(57) ABSTRACT

A cleaning system for removing contamination from at least a part of a surface of a component in a lithographic projection apparatus is disclosed. The cleaning system includes an electric field generator that generates an electric field to provide cleaning particles near the surface of the component.

31 Claims, 4 Drawing Sheets

METHOD FOR CLEANING A SURFACE OF A COMPONENT OF A LITHOGRAPHIC PROJECTION APPARATUS, LITHOGRAPHIC PROJECTION APPARATUS, DEVICE MANUFACTURING METHOD AND CLEANING SYSTEM

CROSS-REFERENCE TO RELATED APPLICATIONS

This application is based on and claims the benefit of priority from European Patent Application No. 02080488.6, filed on Dec. 24, 2002, and German Patent Application No. 10261875.5, filed on Dec. 20, 2002, the contents of which are both incorporated herein by reference.

BACKGROUND OF THE INVENTION

1. Field of the Invention

The present invention relates to a method for removing contamination from a surface of a component of a lithographic projection apparatus. The invention also relates to a lithographic projection apparatus, a device manufacturing method and a cleaning system.

2. Description of Related Art

The term "patterning device" or "patterning structure" as here employed should be broadly interpreted as referring to a device or structure that can be used to endow an incoming radiation beam with a patterned cross-section, corresponding to a pattern that is to be created in a target portion of a substrate. The term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using a suitable electronic device. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step and repeat apparatus. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices, the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

In general, the surfaces of components of a lithographic projection apparatus get contaminated during use, for example, because of hydrocarbon molecules which are always present in the apparatus, even if most of the apparatus is operated in vacuum. It should be noted that in general, an EUV lithographic projection apparatus is a closed vacuum system. Contamination may also be caused by other materials, including but not limited to reactants from radiation induced cracking of hexa-methyl disilazane or other silicon containing materials, for example oxides of silicon. Especially in an apparatus using EUV, the components may suffer from contamination by carbon-containing materials due to radiation induced cracking of hydrocarbon molecules.

In particular, the contamination of optical components in the lithographic projection apparatus, such as mirrors, has an adverse effect on the performance of the apparatus because such contamination affects the optical properties of the optical components. Contamination of optical components, for example, causes losses in reflectivity and transparency, and introduces wavefront errors. This results in short lifetimes of the optics. Contamination of the optical components is especially a problem when using EUV radiation, since the radiation induced contamination, e.g. of carbon, will occur for a large part in the irradiated area, i.e. near the optical components.

In the art, mitigation methods are known to reduce the degree of contamination, for example by suppressing the growth of carbon containing materials on the surfaces of the apparatus.

However, if mitigation is not sufficient, cleaning of the respective component is required. In the ar,t methods for cleaning contaminated surfaces are known, like e.g. removing carbon containing materials using an etching gas, such as oxygen or hydrogen combined with EUV radiation. From European Patent Application EP 1 220 038, a method for cleaning optical components is known, in which optical components are irradiated with micro-wave and/or infra-red radiation. However, such cleaning methods typically require relatively high concentrations of etching agents, typically 5 to 6 orders of magnitude higher than the partial pressure of the hydrocarbon. Furthermore, the local etching rate may not be controlled and thus a higher etching rate per element may occur on some surfaces than on others resulting in a non-homogeneous contamination pattern of the component. If the component is a mirror this might for example result in phase shift errors in the projected radiation.

An additional problem of uncontrolled etching is that during operation, each part of the surface will be exposed to a different degree to the contaminating materials. The resulting growth of contamination on the components varies therefore for each component and even over the surface of a single component. Thus, uncontrolled etching may result in removal of only a part of the contamination on a certain part of the surface while removing all contamination and damaging the surface of the component on another part of the surface.

BRIEF SUMMARY OF THE INVENTION

It is an aspect of the present invention to provide an improved cleaning system for removing contamination from a surface of a component of a lithographic projection apparatus, and in particular a cleaning system providing a better control of the removal of contamination than the known cleaning systems.

Embodiments of the invention provide a cleaning system for removing contamination from at least part of a surface of a component in a lithographic apparatus. The cleaning system includes an electric field generator that generates an electric field to provide cleaning particles near the surface of the component.

The electric field generator can generate an electric field and provide cleaning particles near the contamination by means of the electric field. The contamination is removed because the cleaning particles interact with the contaminating substance. Thus, the removal of the contamination is controlled by the properties of the electric field. Thereby, a controllable removal of contamination is obtained. The providing of cleaning particles may comprise, but is not limited to, one or more of providing with the electric field charge carriers with sufficient energy to remove at least a part of the contamination, e.g. physical sputtering, directing with the electric field cleaning particles to the contamination, generating with the electric field reactive particles such as reactive particles or free radicals (e.g. reactive sputtering) and optionally bringing the reactive particles near the surface. However, the providing of cleaning particles is not limited to these specific methods, but may include any way of providing particles able to interact with contamination on the surface, by which interaction contamination is removed from the surface.

Furthermore, a cleaning system according to an embodiment of the invention may be provided per component, whereby contamination of each component can be cleaned in a manner suitable for the specific component.

With a cleaning system according an embodiment of the invention, control over the cleaning may be obtained in other manners in addition to the electric field, such as, for example, by the type of cleaning particles used and the specific way in which they are provided near the surface.

Furthermore, a cleaning system according to the invention may operate (semi)-continuously, thus preventing actual contaminating of the surface.

Embodiments of the invention also provide a method for removing contamination from at least a part of a surface of a component of a lithographic apparatus. The method includes generating an electric field in at least a part of the lithographic projection apparatus, providing cleaning particles near the contamination with the electric field, and removing at least a part of the contamination via interaction of the cleaning particles with the contamination. In such a method, contamination is removed from a surface of a component of a lithographic projection apparatus in a controllable manner.

The invention further provides a method for cleaning surfaces of laminates or substrates, in which contamination clusters present on the said surfaces are supplied with energy by ion and/or electron radiation, until the clusters are removed.

According to a further aspect of the invention, a device manufacturing method is provided. The method includes removing contamination from at least a part of a surface of a component of a lithographic projection apparatus. Removing contamination includes generating an electric field in at least a part of the lithographic projection apparatus, providing cleaning particles near the contamination with the electric field, and removing at least a part of the contamination via interaction of the cleaning particles with the contamination. The device manufacturing method also includes providing a beam of radiation, using a patterning structure to endow the beam of radiation with a pattern in its cross-section, and projecting the patterned beam of radiation onto a target portion of a substrate. In such a method, contamination is removed from a surface of a component of a lithographic projection apparatus in a controllable manner, while only a short or no interruption of the device manufacturing occurs.

Embodiments of the invention further provide a lithographic projection apparatus. The apparatus includes a radiation system that provides a beam of radiation, and a support structure that supports a patterning structure. The patterning structure is configured to pattern the beam of radiation according to a desired pattern. The apparatus also includes a substrate support that supports a substrate, a projection system that projects the patterned beam onto a target portion of the substrate, and an electric field generator that provides cleaning particles to a surface of a component of the apparatus to remove contamination from said surface. In such an apparatus, contamination can be removed from a surface of a component in a controllable manner. Furthermore, contamination can be removed while interrupting the normal operating for a short time only or not interrupting the normal operating at all.

Specific embodiments of the invention are set forth in the dependent claims. Further details, aspects and embodiments of the invention will be described, by way of example only, with reference to the attached drawings.

DETAILED DESCRIPTION OF EMBODIMENTS OF THE INVENTION

Figure 1:
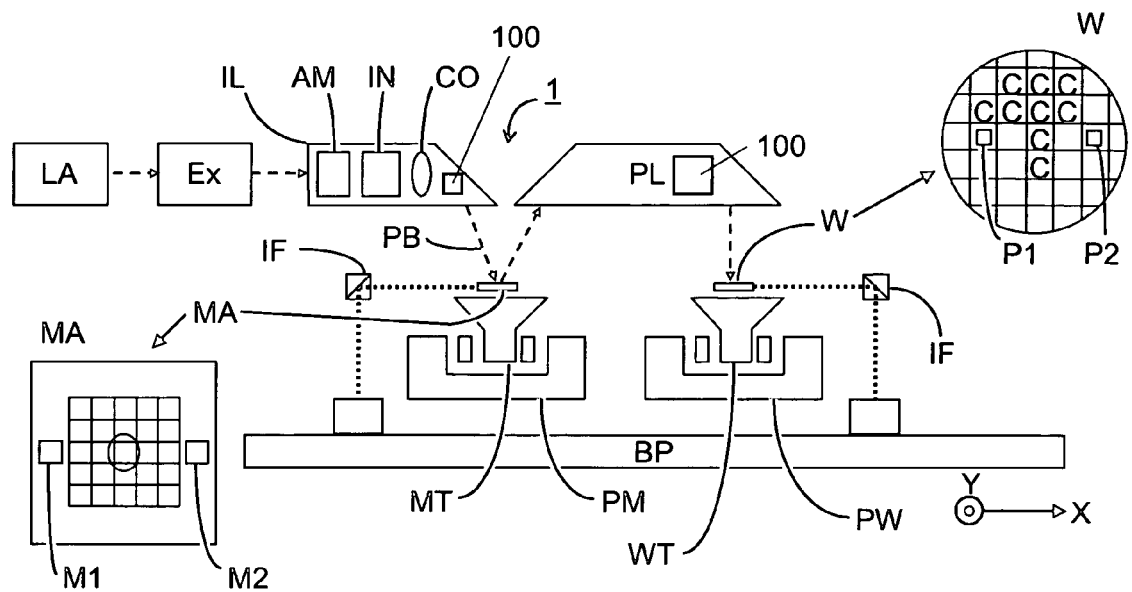
FIG. 1 schematically depicts a lithographic projection apparatus according to embodiments of the invention.

FIG. 1 schematically depicts an example of an embodiment of a lithographic projection apparatus 1 according to the invention. The apparatus 1 typically comprises: a radiation system Ex, IL, for supplying a projection beam PB of radiation (e.g. UV or EUV radiation). In this particular case, the radiation system also comprises a radiation source LA; a first object table (mask table) MT provided with a mask holder for holding a mask MA (e.g. a reticle), and connected to a first positioning device PM for accurately positioning the mask with respect to item PL; a second object table (substrate table) WT provided with a substrate holder for holding a substrate W (e.g. a resist coated silicon wafer), and connected to a second positioning device PW for accurately positioning the substrate with respect to item PL; and a projection system ("lens") PL (e.g. a mirror group) for imaging an irradiated portion of the mask MA onto a target portion C (e.g. comprising one or more dies) of the substrate W. The term "holder" as used herein can also be considered or termed as a support. It should be understood that the term substrate support or substrate table broadly refers to a structure that supports, holds, or carries a substrate.

As here depicted, the apparatus is of a reflective type (i.e. has a reflective mask). However, in general, it may also be of a transmissive type, for example, with a transmissive mask. Alternatively, the apparatus may employ another kind of patterning device, such as a programmable mirror array of a type as referred to above.

The source LA (e.g. a Hg lamp, an excimer laser, an undulator or wiggler provided around the path of an electron beam in a storage ring or synchrotron, a laser-produced plasma source or otherwise) produces a beam of radiation. This beam is fed into an illumination system (illuminator) IL, either directly or after having a traversed conditioning device, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the projection system PL, which focuses the beam PB onto a target portion C of the substrate W. With the aid of the second positioning device PW (and an interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
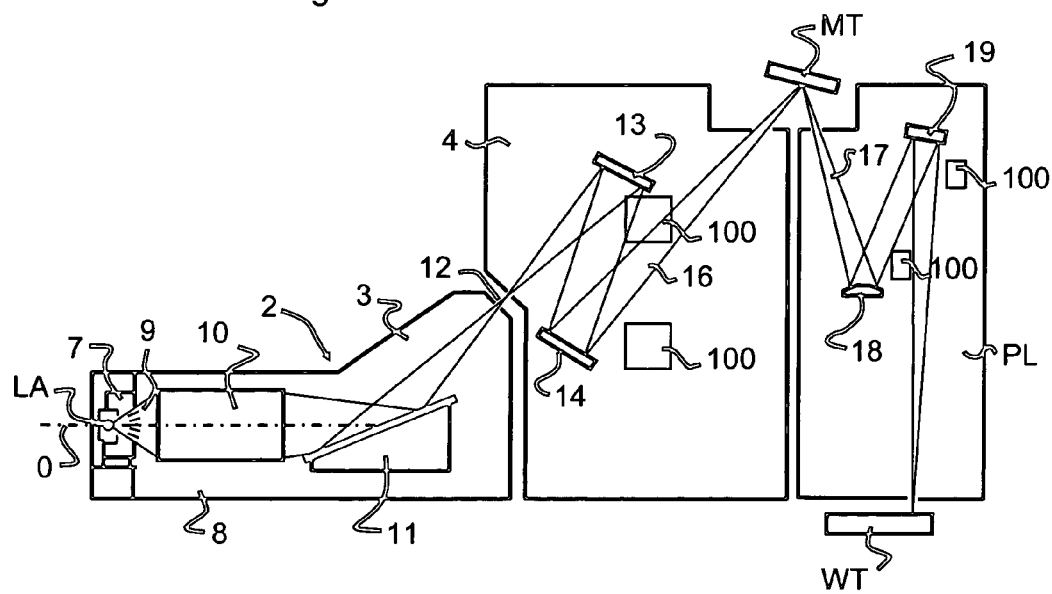
FIG. 2. shows a side view of an EUV illuminating system and projection optics of a lithographic projection apparatus according to embodiments of the invention.

FIG. 2 shows a projection system PL and a radiation system 2 which can be used in the example of a lithographic projection apparatus 1 of FIG. 1. The radiation system 2 comprises an illumination optics unit 4. The radiation system may also comprise a source-collector module or radiation unit 3. The radiation unit 3 is provided with a radiation source LA which may be formed by a discharge plasma. The radiation source LA may employ a gas or vapor, such as Xe gas or Li vapor in which a very hot plasma may be created to emit radiation in the EUV range of the electromagnetic spectrum. The very hot plasma is created by causing a partially ionized plasma of an electrical discharge to collapse onto the optical axis O. Partial pressures of 0.1 mbar of Xe gas, Li vapor or any other suitable gas or vapor may be required for efficient generation of the radiation. The radiation emitted by radiation source LA is passed from the source chamber 7 into collector chamber 8 via a gas barrier structure or "foil trap" 9. The gas barrier structure comprises a channel structure such as, for instance, described in detail in European patent applications EP-A-1 233 468 and EP-A-1 057 079, which are incorporated herein by reference.

The collector chamber 8 comprises a radiation collector 10 which can be formed by a grazing incidence collector. Radiation passed by collector 10 is reflected off a grating spectral filter 11 to be focused in a secondary source point 12 at an aperture in the collector chamber 8. From chamber 8, the projection beam 16 is reflected in illumination optics unit 4 via normal incidence reflectors 13, 14 onto a reticle or mask positioned on reticle or mask table MT. A patterned beam 17 is formed which is imaged in projection system PL via reflective elements 18, 19 onto a wafer stage or substrate table WT. More elements than shown may generally be present in illumination optics unit 4 and projection system PL.

The example of a lithographic projection apparatus 1 according to an embodiment of the invention of FIG. 1 has one or more cleaning systems 100 according to the invention positioned in the projection system PL and the radiation system 2 near the reflectors 13,14 and the reflective elements 18,19, as is shown in FIG. 2. However, other parts of the apparatus may also be provided with a cleaning system according to an embodiment of the invention. For example, a reticle and one or more sensors of the lithographic projection apparatus may be provided with a cleaning system.

Figure 3:
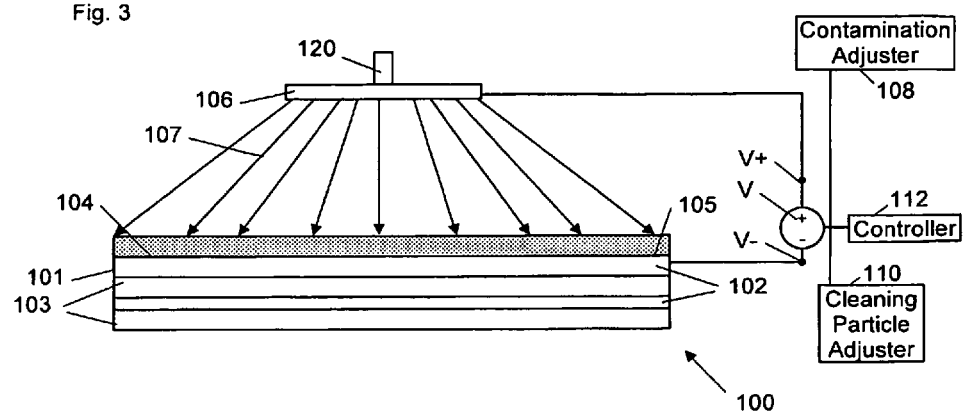
FIG. 3 schematically shows an example of an optical component provided with an example of a cleaning system according to embodiments of the invention.

In FIG. 3, a first example of a cleaning system 100 is shown in more detail. In FIGS. 1 and 2, the cleaning system 100 is positioned inside the apparatus 1. The cleaning system can be controlled in any manner suitable for the specific implementation using any convenient means outside the apparatus 1.

However, suitable means for control of the cleaning system may likewise be provided inside the apparatus. For example, the cleaning system 100 may be communicatively connected to a measuring device which measures a level of contamination of one or more surfaces of one or more components in the apparatus 1, for example, by measuring secondary electrons emitted from the surface. Thus, the measuring device may output a signal which activates the cleaning system 100 according to the invention if the surface is contaminated to a certain degree.

Figure 4:
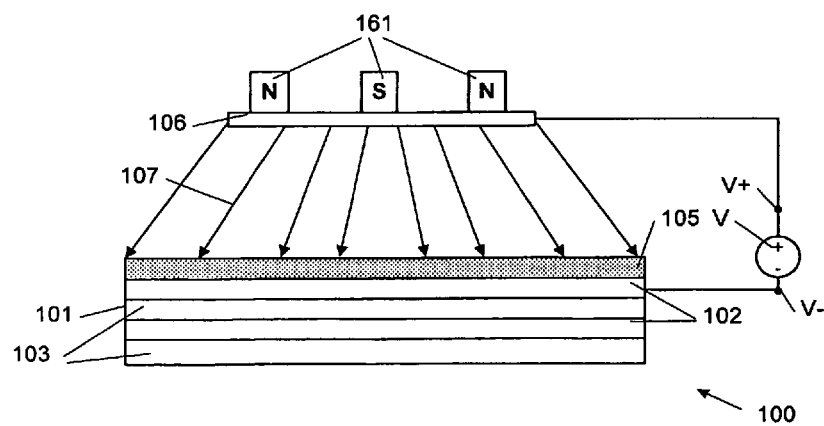
FIG. 4 schematically shows an example of an optical component provided with another example of a cleaning system according to embodiments of the invention.

In FIGS. 3 and 4, an optical component and examples of a cleaning system 100 according to an embodiment of the invention are shown. The optical component to be treated is a multi-layer mirror 101 with a layered structure. Non-optical components or optical components other than mirrors may also be treated. The mirror 101 comprises a number of alternating layers 102 and 103 having a refractive index $n_1$ and $n_2$, respectively below a surface 104 of the mirror. A layer of contamination material 105, e.g. carbon or silicon (-oxide) containing materials or physisorbed particles, has been deposited on the surface 104 of the mirror 101.

The layers 102 and 103 may for example be made of silicon (Si) and molybdenum (Mo), respectively, which materials are especially suited for mirrors in EUV lithographic apparatus. Multi-layer mirrors may be referred to as uncapped or capped. An uncapped multi-layer mirror has a surface layer similar to the other layers, while a capped multi-layer mirror has one or more surface layers to prevent damage, e.g. oxidation to the multi-layer. The surface layer or 'cap' is typically of a material different than the other layers in the mirror, for example a surface layer made of Ru. For the sake of brevity, the multilayer mirror and the projecting system are not described in further detail, as multi-layer mirrors are generally known in the art of lithographic projection.

The cleaning system 100 has a cleaning particle provider, which in this example comprises an electric field generator. In this example, the electric field generator comprises an electrode 106, a voltage supply V and the mirror surface 104. The surface 104 is electrically connected to a negative contact V− of the voltage source V. The electrode 106 faces the surface 104 and is connected to a positive contact V+ of the voltage source. The voltage source V can apply a voltage difference between the surface 104 and the electrode 106 and thus an electric field 107 can be generated between the surface 104 and the electrode 106, as indicated by arrows 107 in FIGS. 3 and 4. Thereby, the surface 104 of the mirror is positioned in an electric field.

The electric field 107 provides cleaning particles near the contamination layer 105, which cleaning particles can interact with the contamination and through this interaction remove the contamination. The providing of cleaning particles and the interaction of the cleaning particles with the surface may for example comprise a dry etching process such as plasma etching, reactive ion etching or ion milling. Further information regarding dry etching can be obtained, for example, from the book "Microchip Fabrication: A Practical Guide to Semiconductor Processing", Third Edition, by Peter van Zant, McGraw Hill Publishing Co., 1997, ISBN 0 07 067250 4, pages 266–273 incorporated herein by reference. However, the invention is not limited to dry etching. Any other type of providing of cleaning particles and interaction of the cleaning particles with the surface suitable for the specific implementation may be used and the contamination may likewise be removed, for example, using electrons with sufficient kinetic energy only.

The providing of cleaning particles may comprise, but is not limited to, bringing already existing cleaning particles towards the contamination. For example, already existing charge carriers, such as free electrons which are almost always present near the electrode, may be provided by means of the electric field with sufficient energy to remove at least a part of the contamination, e.g. via physical sputtering, or directed with the electric field to the contamination. Free electrons may also originate from the surface of the component or another electron source.

The providing of cleaning particles may likewise comprise generating or creating cleaning particles (and when necessary bringing the cleaning particles to the contamination). For example, reactive particles such as reactive ions or free radicals may be generated with the electric field (e.g. reactive sputtering), for example from a gas already present in the electric field or supplied to the electric field by a gas supply, such as via a fluid channel connected to a vessel with pressurized gas. Optionally the reactive particles may be brought near the surface. Likewise, electrically neutral particles may be charged electrically by means of the electric field, e.g. gas particles may be ionized via collisions with electrons accelerated by the electric field. The charged particles may then be accelerated towards the contamination and interact with the contamination by transferring kinetic energy to the contamination, e.g. physical sputtering. However, the invention is not limited to these specific ways and any way of providing cleaning particles able to interact with contamination on the surface may be used.

The cleaning particles may be any type suitable for the specific implementation and may, for example be charge carriers accelerated by the electric field. The cleaning particles may likewise be non-charged cleaning particles, for example generated near the contamination by interactions with charge carriers which are accelerated by the electric field to the area of the contamination or which charge carriers are generated at a distance from the contamination and then moved to the contamination in a suitable manner, such as a diffusion mechanism or a fluid flow. The cleaning particles may for example be gas particles, such as gas molecules or atoms, ionized by electrons accelerated by the electric field, which ionized particles chemically interact with the contamination. The cleaning particles may also be free radicals from for example oxygen dissociated by electrons accelerated by the electric field, which free radicals react with materials in the contamination. Also, the cleaning particles may be molecules in an excited state, excited by means of the electric field or by means of particles provided by means of the electric field, e.g. energetic electrons. The cleaning particles may also be electrons produced by the ionization of gas molecules. However, other types of cleaning particles may also be provided by means of the electric field and the invention is not limited to a specific type of cleaning particle. The cleaning particles may likewise be a combination of types of cleaning particles, for example a mixture of electrons and ions or otherwise, and the invention is not limited to cleaning particles of a single type.

Likewise, the interaction of the cleaning particles with the contamination may be of any type suitable for the specific implementation, such as a chemical interaction, a physical interaction (e.g. a transfer of kinetic energy), a combination of chemical and physical interactions or otherwise.

In a method according to an embodiment of the invention and with a cleaning system according to an embodiment of the invention, the cleaning can be controlled via the electric field. However, the invention is not limited to control via the electric field and other aspects may be used in addition to the electric field to provide control over the cleaning, such as for example type of the cleaning particles and the specific way in which they are provided near the surface. The cleaning system may for example comprise a contamination related adjuster device 108 which is communicatively connected to the electric field generator device and can adjust at least one property of the electric field in relation to at least one property of the contamination to be removed. For example, the contamination related adjuster device 108 may change the strength of the electric field in relation to materials to be removed from the surface, as will be explained below. However, the contamination related adjuster device 108 may likewise adjust other properties of the electric field, such as a field modulation frequency, direction of the electric field or otherwise in relation to other properties of the contamination, such as the thickness or the effect of the contamination, e.g. on the optical properties of a mirror.

A cleaning system according to an embodiment of the invention may comprise a cleaning particle related adjuster device 110 communicatively connected to the electric field generator device, for adjusting at least one property of the electric field related to at least one property of cleaning particles to be provided. For example, when a gas is present in the electric field, the strength of the electric field may be adjusted such that the gas is not ionized anymore and electrons are provided as cleaning particles instead of ions. The cleaning particle related adjuster device 110 may comprise a device which can adjust at least one property of the cleaning particles to be provided and/or the electric field in relation to at least one property of the contamination to be removed. For example, this device can change the types of cleaning particles or their energy to selectively remove one material present in the contamination, as will be explained below in more detail.

In the examples of FIGS. 3 and 4, charge carriers present in the space between the electrode 106 and the surface 104 will be accelerated by the electric field towards the electrode 106 or the surface 104, depending on the type of charge, i.e. negative or positive and the direction of the electric field 107. In the illustrated example, the surface 104 is at a negative potential and will thus attract positive charge carriers, e.g. positively charged ions. The electrode 106 is at a positive potential and will thus attract negative charge carriers, e.g. electrons. The surface 104 may likewise be at a positive potential and thus attract negative charge carriers.

The charge carriers accelerated towards the surface 104 will impinge on the contamination layer 105. The impinging charge carriers transfer at least a part of their energy, e.g. the kinetic energy, to the molecules in the contamination layer 105 and thus can release the molecules from the surface. At least a part of the contamination is thereby removed. In general, the process of accelerating and impinging of charge carriers is referred to from hereon as sputtering or etching. However, the terms sputtering and etching are not limited to the steps of accelerating and impinging.

The charge carriers accelerated by the electric field may be of any type suitable for the specific implementation. The charge carriers may for example include secondary electrons emitted from the surface of the component, charged particles such as ions, for example, induced by electromagnetic radiation, such as Deep Ultra Violet (DUV) or Extreme Ultra Violet (EUV) radiation or ions generated by collisions with electrons, a combination of those types of charge carriers or otherwise. The charge carriers may already be present in the system or inserted or generated during the cleaning. For example, a gas can be inserted near the surface to be cleaned and then be ionized by energetic electrons generated with the electric field or EUV/DUV radiation.

The electric field 107 can be applied individually per component by adding an electrode near the component, like the electrode 106 near the mirror 101 in FIG. 3, or by applying a voltage to the respective component without using an extra electrode. In the latter case, one or more other components of the lithographic projection apparatus 1 may serve as a counter electrode; for example, components connected to ground may be used as a counter electrode, such as the vacuum vessel in a EUV system. Likewise, a different voltage may be applied to a component acting as a counter electrode or the component may be grounded. Both cases result in the surface of the component which is to be cleaned being positioned in an electric field. The electrode near the component may for example be a wire grid or a mesh with suitable wires in the mesh or grid and an appropriate pitch. Such wire grid or mesh can both be relatively transparent for radiation and especially electromagnetic radiation such as EUV. The cleaning system may for example use the same counter electrode as used for a contamination monitoring module which measures secondary electron yield to determine the contamination. The surface of the component, e.g. of the mirror, may also be positioned in an electric field without being connected to a voltage source. For example, the mirror can be placed in an electric field between the negative and positive electrode plates of a capacitor device. This is especially suited for, but not limited to, components having a surface with a low electrical conductivity, e.g. a surface of an isolating or undoped semiconductor material.

Via the electric field the removal of the contamination material can be controlled easily and accurately. For example, by applying a suitable voltage difference between the electrodes, e.g. over the electrode 106 and the surface 104, the electric field strength can be controlled and thus the energy of the impinging cleaning particles or rate at which cleaning particles are generated can be controlled.

However, the field strength may likewise be controlled in a different manner, for example by changing the position of the electrode with a mechanical actuator 120, such as a stepping motor or otherwise. Thus, for example, the distance between the electrode and the surface can be changed. Likewise, the strength of the electric field can be changed via control over addressable grids in the electrode. By varying for example the strength of the electric field locally or by an appropriate design of the electric field and the electrode, the rate of material removal, referred from hereon as the etching rate, can be controlled locally. The electric field may likewise be controlled via an adjustable geometry of the electrodes. For example, a number of electrodes may be positioned near a surface of a component which together act as a combined electrode and the electrodes may be put at different potentials, thus providing a combined electrode with an adjustable geometry and size. Thus, the etching rate can be adapted to local differences in for example the thickness of the contamination layer or the materials of the contamination layer. Also, the direction of the impinging particles can be controlled via the direction of the electric field. Furthermore, in the electrode configuration, the etching rate can be controlled by the angle of incidence of the impinging charge carriers, as the etching rate strongly depends on the angle of incidence. At oblique angles of incidence for ion irradiation etching rates are known to be much higher than at normal incidence. Also, the angle of incidence has a different effect on the removal of different materials. Thus, materials can selectively be removed by a suitable angle of incidence.

A method or cleaning system according to an embodiment of the invention can be applied to remove contamination in one step or applied to remove contamination in two or more removals of contamination at the same surface. For example, the surface may be cleaned in at least two removals which may differ in at least one aspect from each other. For example, the cleaning may comprise a first removing of a part of the contamination from a specific part of the surface and thereafter a second removing which differs in at least one aspect from the first removing and which removes some or all of the remaining contamination from that specific part of the surface. For example, the first removing may be non-selective with respect to the types of materials removed from the contamination, while the second removing is selective and removes substantially only one or more specific predetermined types of materials. It is also possible that the first removal has a higher removal rate than the second removal, thus initially having a fast cleaning while thereafter the cleaning is slower but for instance is more controlled and over etching is prevented if after the first removing only a thin layer of contamination remains. However, it is likewise possible to perform more removals which may or may not differ in at least some aspects with respect to each other and the invention is not limited to a specific amount of removals.

The electric field may be substantially constant in time. The electric field generator may then be provided with a control device 112 which keeps the electric field constant. For example, a control device may be provided which comprises an electric field sensor and a feedback ioop which adjusts the voltage of the electrode 106 to keep the field constant. However, the electric field may also be kept constant in a different manner, for instance in the examples of FIGS. 3 and 4 by using a DC voltage supply.

The electric field generator may be provided with a vary device which varies the electric field in time. For example, in the examples of FIG. 4, the vary device may comprise an AC-voltage supply connected to the electrode 106 and the mirror 101. Such a varying electric field may for instance have a component constant in time on which a component varying in time is superimposed, for example using in the examples of FIGS. 3 and 4, a voltage supply which provides an AC-voltage superimposed on a DC-voltage. The electric field may likewise be an alternating field, e.g the direction of the field is reversed in time, thus switching the surface between a positive and a negative potential. For reversing the electric field, the electric field generator may be provided with a reverse mechanism. Such a reverse mechanism may for instance be in the examples of FIGS. 3 and 4 a voltage supply which has an output, connected to the component 101, at which output alternately a positive voltage and a negative voltage is supplied.

If a varying electric field is used, the electric field may be modulated with a modulating frequency related to a property of the charge carriers to be accelerated to the component. The property can for example be the (relative) amounts of different types of charge carriers, because the frequency of the electric field is related to the (relative) amounts of different types of charge carriers impinging on the surface 104, as is generally known in the art of plasma sputtering. The modulated electric field can for example be on/off modulated, that is the field is alternately switched on and off. The amount and energy of the ions impinging on the mirror surface can be controlled in an on/off modulated field through the period the field is switched on and the period the field is switched off.

The modulated field may for example be a pulsed electric field, that is an electric field having a relatively short on-time, typically less than half a period, compared to the off-time. For example, the electric field generator may comprise a pulsed field generator which generates a pulsed electrical field. Properties of the charge carriers accelerated towards the component can be controlled by adapting the pulse width of the electric field in a suitable manner. For example, for ions, the pulse width influences both the energy of the ions impinging at the surface and the amount of ions impinging on the surface (per modulation period), also referred to as the ion flux. Therefore, control of the pulse width results in a controlled amount of ions impinging on the surface with a controlled energy. The pulse generator may, for example, comprise in the examples of FIGS. 3 and 4, a pulse width control circuit which controls the duration of the open state of a switch connected in series with the voltage source V. However, control of the pulse width can likewise be implemented in any other way suitable for the specific implementation.

Experiments have shown that the etching rate, also referred to as the sputter rate, can thus be varied with a large degree of accuracy between zero (no sputtering) up to less than 20 nm/min for a pulse width in the range of about 1 nanosecond to about 10 milliseconds and a modulation frequency between about 1 kHz and about 100 kHz. An etching rate up to about 10 nm/min was found for a modulation frequency below a few times 10 kilohertz for a pulse width between about several nanoseconds and about a few milliseconds. However, the invention is not limited to these experimental results.

In a method or system according to an embodiment of the invention, electromagnetic radiation can be projected on a part of or the whole of the surface of the component while the surface is being cleaned. The radiation can for example be Deep Ultra Violet (DUV) or Extreme Ultra Violet (EUV) radiation. DUV or EUV radiation can ionize gas molecules and thus create charge carriers. Thereby, the removal of contamination is increased since more cleaning particles are present. The radiation may be applied over the whole surface or be applied only locally on a part of the surface, for example using a dedicated reticle as the mask MA in the apparatus 1 of FIG. 1, which reticle produces a radiation beam profile locally at the contaminated surface, e.g. the mirror, which radiation beam profile corresponds to the thickness of the layer of contamination to be removed from the surface. Thereby, the component is cleaned locally only, thus preventing over etching or an non-homogeneous removal. The electromagnetic radiation may be provided in any suitable manner, for example the cleaning systems 100 in FIGS. 3 and 4 may be provided with a radiation device or radiation from the radiation source LA in FIGS. 1 and 2 may be projected on the surface.

Also, in a cleaning system or method according to an embodiments the invention, a magnetic field may be applied by means of a magnetic field generator device to control the charge carriers. The example of a system of FIG. 4 has a permanent magnet 161 which is positioned near the electrode 106 to contain the secondary electrons in the area near the electrode 106 and thus stimulate the generation of ions. In FIG. 4, the permanent magnet 161 has two north poles N and a south pole S between the north poles. The magnet 161 thus has a magnetic field which creates a zone ("magnetic trap") near the electrode 106 where the electron loss rate is reduced and the ionization probability enhanced.

The electrode(s) used to generate the electric field 107 can have a surface of a material which is substantially similar to the material of the surface of the component. Thereby, contamination of the surface of the components with material removed by charge carriers from the surface of the electrode(s) is prevented.

In an example of an embodiment of the invention, surfaces of laminates or substrates, e.g. surfaces of masks and of laminates serving as reflecting optical elements in lithographic apparatus, on which contamination clusters are present, are cleaned by supplying contamination clusters with energy by ionic and/or electron radiation, until these are removed. The diameter of these contamination clusters typically ranges from about a few tens of nanometers (about 80 nm) to about a few micrometers, with a height ranging from a fraction of a nanometer to at least about 40 nm. They normally comprise predominantly carbon, oxygen, sulphur, nitrogen and/or silicon. However, the clusters may likewise have different constituents and/or have different dimensions. The contamination clusters can arise from placing a mirror in a certain residual gas atmosphere, or from radiation by electrons, or by photons having wavelengths in the range from DUV—over EUV—to Röntgen, or in a residual gas atmosphere under the influence of an external electric field.

This embodiment can be applied specifically to a lateral size scale in the nanometer range. By the smallest ion or electron beam size, specifically nanometer size contamination clusters can be removed. However, if required, a global cleaning can also be performed by appropriate enlargement of the particle beam cross-section.

Two different processes can contribute to the removal of the contamination clusters from the surfaces. On the one hand, a mechanical removal occurs by firing particles, on the other hand, a "stress-release" mechanism also occurs, i.e. by particle radiation energy is supplied until the contamination clusters so to speak crack.

Apart from the choice of the kind of radiation particles, the cleaning method can be controlled more accurately by the parameters: energy of the particle beams, angle of incidence and radiation time. All three parameters should preferably be adjusted such, that on the one hand the clusters crack and/or are ablated, and on the other hand the surface roughness and/or the homogeneity of the layer thickness remains essentially unmodified. Depending on particle kind and surface material the parameter ranges must thus be chosen such, that a balance is obtained between the removal of the clusters and the modification of the surfaces.

For removing the clusters, the ion beam energy can for example be between about 40 eV and about 2000 eV and the electron beam energy be between about 40 eV and about 15000 eV. The angle of incidence of the ion beam respect to the surface can be in the range from about 4 degrees to about 45 degrees, the angle of incidence of the electron beam from about 70 degrees to about 90 degrees, and the radiation times between about 0.5 seconds and about 300 seconds.

For the ion beam, preferably inert gas ions (i.e. helium, neon, argon or krypton ions), halogen ions (i.e. fluoride, chloride, bromide or iodide ions) and/or gallium ions can for instance be applied. On the one hand, from a technical point of view, these ions are suitable for providing a ion beam. On the other hand, by means of such ion beams, contamination clusters can be removed particularly well, without affecting too much the surface roughness and/or the homogeneity of the layer thickness.

The cleaning method according to the invention is well suited for removing clusters from surfaces which comprise e.g. molybdenum, molybdenum carbide, ruthenium, rhodium, iridium, gold, wolfram, nickel, boric carbide, silicon, beryllium, silicon nitride, silicon dioxide, boric nitride, titanium, titanium dioxide, titanium nitride, yttrium, yttrium oxide, cerium, rhodium oxide, zirconium, zirconium oxide, niobium, copper-gold compositions (i.e. $Cu_3Au$, AuCu, $Au_3Cu$), palladium or platinum. In particular, for the cleaning of EUV-optics, such as, for example, multilayers, the surfaces should comprise these layer materials. Particularly suitable as substrate materials are silicon, quarz, or different kinds of glass (e.g. Zerodur (product of the company Schott), ULE (product of the company Corning)).

In the following four examples of removing clusters of contamination with an example of a method according to the invention are described.

EXAMPLE 1

Firing of the layer contaminated by contamination clusters with Ne-ions of an energy from about 0.5 keV to about 1.0 keV and a current in the micro-ampere range (dependent on the ion source) with an angle of incidence with respect to the surface from about 10° to about 30° during a time period of less than about 30 seconds, results in removal of the contamination clusters. The surface roughness of a rms-value of about 0.3 nm remains practically unchanged. If the upper layers are very thin and if these comprise of a metal, e.g. ruthenium, or a semiconductor, e.g. silicon, a negligibly small commingling of these layers can take place.

EXAMPLE 2

Specifically firing, with the aid of a scanning electron microscope, of the contamination clusters with about 10 keV electrons with a current in the nano-ampere range during a time period of less than about 60 seconds under an angle of about 85° to about 90° with respect to the surface, results in cracking of the contamination clusters. The remaining material residuals can subsequently be removed e.g. through a UV-ozone cleaning. Almost no commingling of the upper layers takes place. The surface roughness of a rms-value of about 0.25 nm remains unchanged.

EXAMPLE 3

Firing of the contamination clusters with about 1 keV Ar-ions and a current in the micro-ampere range with an angle of incidence with respect to the surface of less than about 30° during a time period of about 10 to about 20 seconds, results in a removal of the contamination clusters. Since the mass of argon is essentially higher than the mass of the materials in the contamination cluster, a slight commingling of the upper layers can take place, when the upper layers comprise metals, e.g. rhodium, or a non-metal, e.g. silicon nitride, and when these are very thin. The surface roughness again remains nearly uninfluenced.

EXAMPLE 4

Specifically firing, under a scanning electron microscope, the contamination clusters with about 0,5 keV Kr-ions with a current in the micro-ampere range under an angle of incidence with respect to the surface of less than about 30°, as well as with about 12 keV electrons with a current in the nano-ampere range under an angle of incidence from about 80° to about 85° with respect to the surface during a time period of about 10 to about 20 seconds, results in a removal through ablating and cracking of the contamination clusters. Since the mass of krypton is essentially higher than the mass of the materials in the contamination clusters, a slight commingling of the upper layers can take place, when the upper layers comprise metals, e.g. iridium, or a nonmetal, e.g. boric carbide, and when these are very thin. The surface roughness again remains nearly uninfluenced.

The cleaning system 100 of FIGS. 3 and 4, or a cleaning system operating in accordance with any of the methods as disclosed herein, can be adjusted in a simple manner to selectively remove contamination of a specific material, for example, by changing one or more properties of the electric field, such as the strength or frequency or by changing the type of charge carriers. Thereby, for example, contamination with carbon containing materials or silicon containing materials can selectively be removed from the surface of the component without removing materials from the actual mirror surface, e.g. Si or Mo in a layer of a multi-layer mirror. Such a selective removal is especially suited for EUV multi-layer mirrors. Such mirrors are relatively sensitive to "over-etching" because removing too much material from the contaminated surface will destroy the proper surface of the multi-layer mirror, i.e. the surface of the mirror before contamination, and therefore the optical characteristics of the mirror.

Selective removal of materials can for example be obtained by accelerating charge carriers to a specific velocity or kinetic energy, e.g. by controlling the strength of the electric field or otherwise. In general, a threshold exists for physical sputtering that depends primarily on the surface binding energy $E_{bind}$ of the atom to be removed and on the maximum transfer efficiency between projectile and target [i.e. $4*M_{t.a.}*M_{s.i.}/(M_{t.a.}+M_{s.i.})^2$], $M_{t.a.}$ representing the mass of the target atom and $M_{s.i.}$ representing the mass of the sputtering ion (i.e. the projectile). In fact, to achieve ejection of the target atom from the surface the effectively transferred energy should be larger than the surface binding energy $E_{bind}$. The minimum energy needed for ejection is called the minimum displacement energy threshold $E_{displ}$ for physical sputtering.

Figure 5:
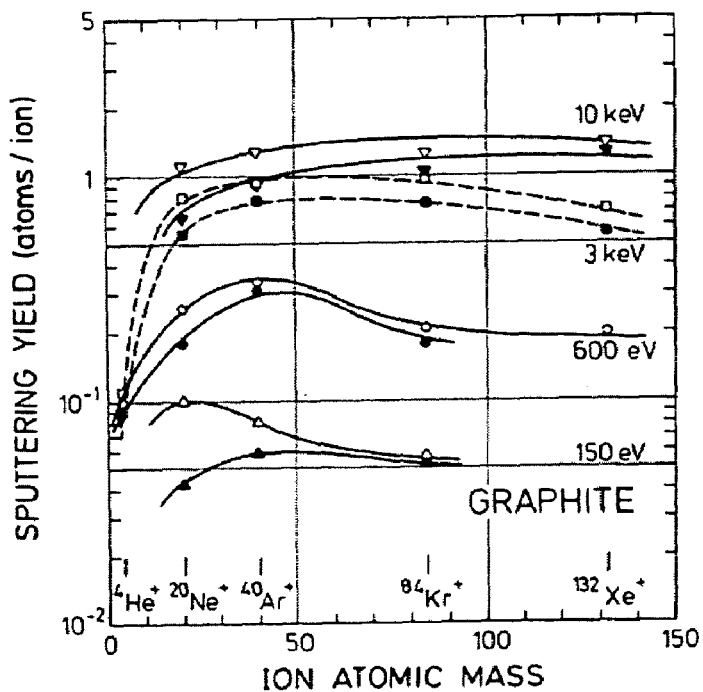
FIG. 5 shows a graph of the sputtering yield in graphite atoms per ion as a function of ion atomic mass for several ion energies.

FIG. 5 (obtained from: E. Hechtl, J. Bohdansky, "Sputtering behaviour of graphite and molybdenum at low bombarding energies", J. Nucl. Mat. 122/123 (1984) 1431) shows measured sputter yields of graphite as a function of ion atomic mass for a bombardment with various noble gas ions of different kinetic energies. Graphite is a reference material being close to the structure of the carbon contamination of an EUV lithographic projection apparatus, hence results obtained for graphite can be applied to other carbon-containing materials. In FIG. 5, the sputtering yields of graphite of two orientations are shown. The open symbols represent graphite cut parallel to the carbon layers in the graphite structure and the closed symbols represent graphite cut perpendicular to the carbon layers. As can be deduced from FIG. 5, by reducing the kinetic energy of the sputtering ions the sputter yield can be reduced significantly and thus by a suitable kinetic energy of the charge carriers the contamination can be removed selectively. For example, experiments show that under EUV radiation at a pressure of approximately 10-3 mbar Ar selective removal of carbon containing materials by physical sputtering (but with a very low sputter yield) is possible even with ions having a kinetic energy below about 150 eV, and in particular with ions having an energy of around 100 eV and 40 eV.

Table 1 shows the minimum displacement energy thresholds $E_{displ}$ for physical sputtering (with Ar ions) of some types of surface materials. As is shown in table 1, graphite has a threshold $E_{displ}$ of 25 eV, while Au has a threshold $E_{displ}$ of 36 eV. Hence, graphite can for example be removed from an Au mirror very selectively, i.e. cleaning without damage to the mirror surface, with Argon ions having a kinetic energy of about 30 eV, since this energy is above the threshold for graphite, but below the threshold for Au. Similarly, Si can be removed with Ar ions having an energy below about 20 eV from Ru surfaces and Si can be removed with Ar ions having an energy below about 36 eV from Au surfaces. It should be noted that other materials can be selectively removed as well and the invention is not limited to a specific combination of materials.

TABLE 1

Minimum displacement energies for physical sputtering.

| | |
|---|---|
| C (graphite) | 25 eV |
| C (diamond) | 35 eV |
| Si | 13–16 eV |
| Mo | 36 eV |
| Ru | 20–35 eV |
| Au | 36 eV |

To selectively remove certain materials from the surface of a component in the lithographic projection apparatus, reactive ion etching (RIE) can be also used. In reactive ion etching, ions are accelerated by an electric field towards a surface and then chemically react with the surface material, contrary to physical sputtering where the ions do not react with the surface material but only transfer kinetic energy to the molecules on the surface. However, in most RIE processes also some kinetic energy is transferred from the ions, and thus physical sputtering occurs as well.

Depending on the material to be etched reactive ions can for example be $O^+$, $H^+$, $N^+$, $F^+$, $Cl^+$, $Br^+$ (obtained from reference: S. Tachi, S. Okudaira, "Chemical sputtering of silicon by $F^+$, $Cl^+$, and $Br^+$ ions: reactive spot model for reactive ion etching", J. Vac. Sci. Technol. B 4, 2 (1986) 459) or otherwise. These ions can be added to the system by adding a component, e.g. gas or otherwise, containing these parts or from which these parts can be generated, e.g. chemically bonded atoms from which reactive ions can be made. For example, if only carbon-containing materials are to be removed, these reactive ions can react with the carbon-containing materials to form new chemical compounds such as for example carbon-oxides ($CO_x$). If these formed compounds are volatile, which is usually the case, the carbon-containing materials are removed from the surface.

Figure 7:
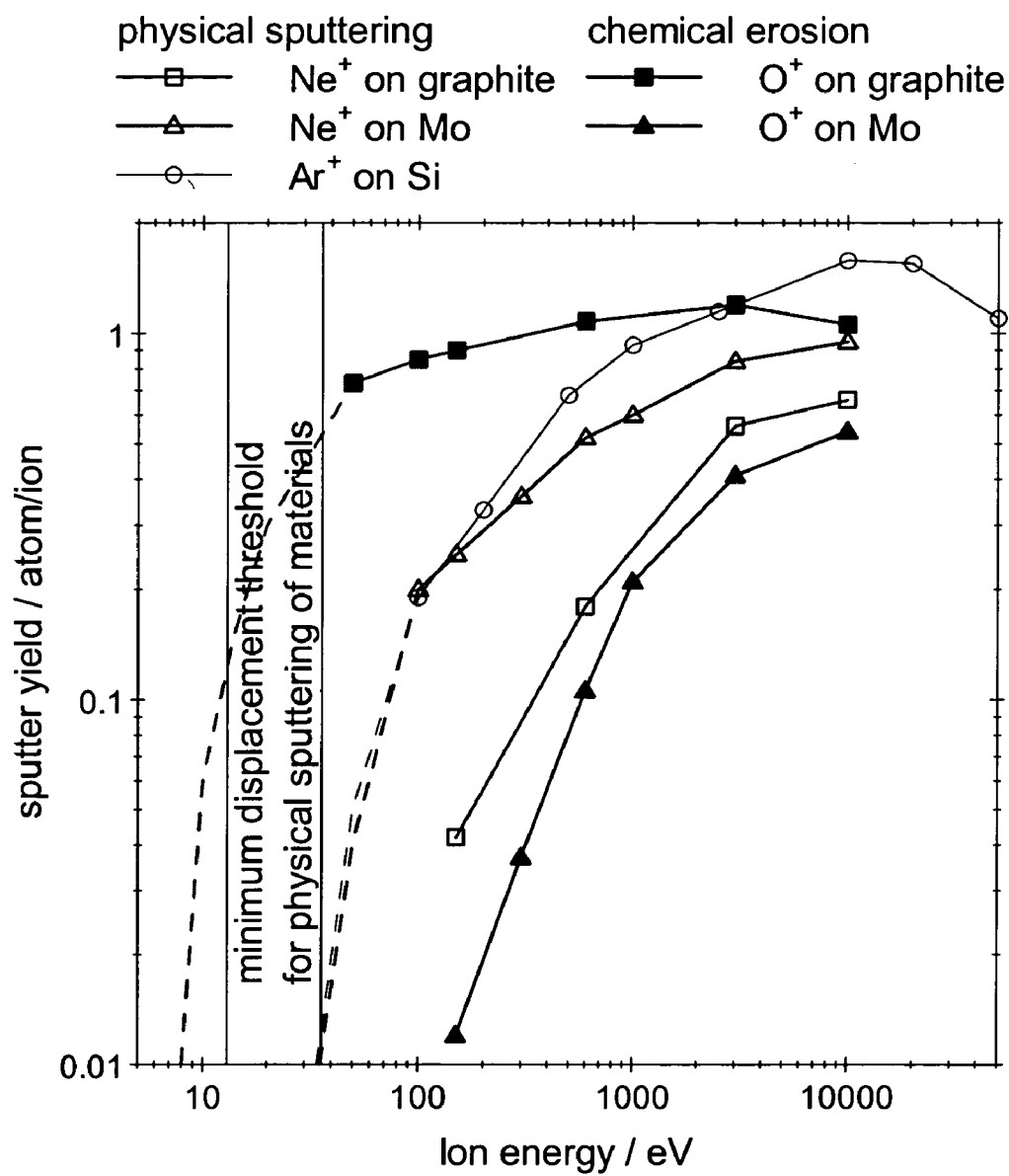
FIG. 7 shows a graph of the chemical sputtering yield in atoms per ion as a function ion energy for physical sputtering of Si, Mo and graphite with $Ne^+$ and $Ar^+$ ions and for reactive ion etching of graphite and Mo with $O^+$ ions.

FIG. 7 shows experimental sputter rates for physical sputtering and RIE on graphite, Mo and Si. In FIG. 7 the sputtering yield is shown as a function of ion energy in electron Volts (eV). As is shown in FIG. 7, physical sputtering was performed with Neon ($Ne^+$) ions for graphite and Mo and with Argon ($Ar^+$) ions for Si. RIE was performed with Oxygen ions ($O^+$) for graphite and Mo.

For low ion energies, it has been determined by weight loss measurement that the total erosion yield of graphite by oxygen ion bombardment was around one, nearly independent of temperature and incident ion energy. This indicates that chemical erosion dominates physical sputtering in the low energy range. In FIG. 7 it is shown that RIE of Mo is effective for $O^+$-ion energies of 150 eV and higher, whereas carbon can already be removed by reactive $O^+$-ion etching with $O^+$-ion energies of less than 10 eV. Hence, a low energy (less then or equal to 150 eV) $O^+$ sputtering can be used to obtain a very high (2 orders of magnitude) selectivity of removing carbon from e.g. a Mo surface.

As can be derived from FIG. 7, at ion energies for example lower than 100 eV, a selective removal of carbon from a Mo or Si surface can be obtained with a selectivity of about 100 to 1, while for ion energies between about 5 and about 25 eV, an even higher selectivity can be achieved. For the removal of aromatic and graphite like materials, an ion energy of more than about 5 eV is preferred for the cracking of the chemical binding, whereas for physical sputtering a minimum displacement energy of about 25 eV is advantageous. For removing physisorbed molecules from a surface even lower energies might be enough. Electron stimulated desorption can be used to remove physisorbed molecules and weakly chemisorbed molecules. Furthermore, excited molecules such as $O2^*$ are known in the art to contribute to chemical etching.

Figure 6:
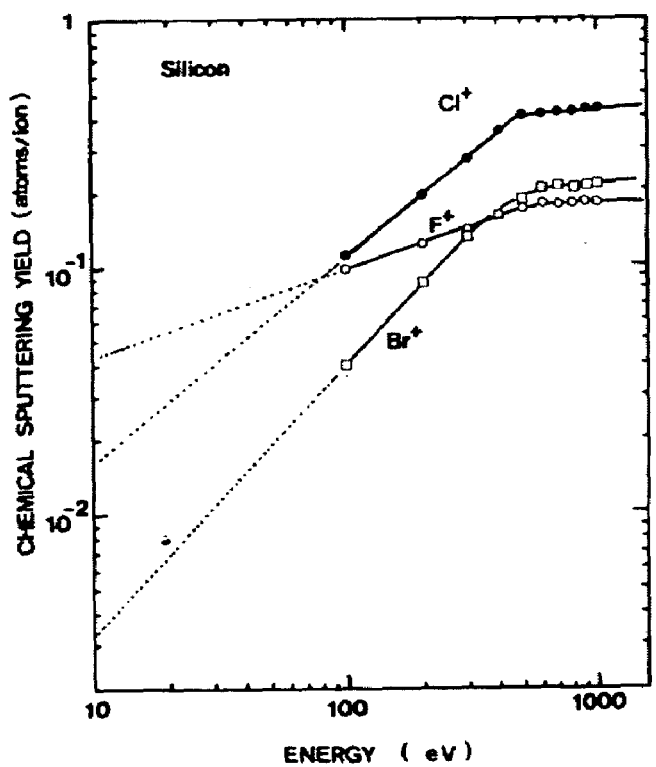
FIG. 6 shows a graph of the chemical sputtering yield in silicon atoms per ion as a function of ion energy for reactive ion etching with $Cl^+$, $F^+$ and $Br^+$.

FIG. 6 (also obtained from above cited reference: S. Tachi, S. Okudaira, . . . ) shows the chemical sputter yields of RIE of Si by $Cl^+$, $F^+$ and $Br^+$ ions, i.e. derived by subtracting the physical sputtering component. These results indicate the high potential of selective chemical etching by choosing the proper ion energy and ion dose.

In order to detect the specific parameters of a method according to an embodiment of the invention, such as (local) etching rate, electric field strength or otherwise, existing detection schemes for the thickness of the contamination layer can be used, such as for example optical detection, ellipsometric detection or detection using secondary electrons.

A method according to an embodiment of the invention can be applied as an off-line cleaning, that is cleaning when the lithographic projection apparatus is not in use which state is also referred to as off-line. However, it is likewise possible to apply a method according to an embodiment of the invention while the apparatus is on-line or in use, for example by triggering the pulses of the electric field with respect to the pulsed EUV source. This prevents down-time and reduces therefore cost of ownership. For the sake of clarity, off-line cleaning comprises cleaning in the lithography apparatus when it is not exposing wafers. On-line cleaning comprises cleaning in the lithography apparatus during exposure. Both on-line and offline cleaning are performed in-situ, i.e. the respective components do not have to be removed from the apparatus during cleaning. On-line cleaning may be performed at intervals, for example after a surface is contaminated to a certain degree. However, such on-line cleaning may also be performed in a (semi) continuous manner, thus preventing substantial growth of contamination. A cleaning method according to the invention performed in a (semi) continuous manner thus may be regarded as a mitigation method.

An on-line cleaning method according to an embodiment of the invention may for example include a device manufacturing method comprising: providing a substrate that is at least partially covered by a layer of radiation-sensitive material; providing a projection beam of radiation using a radiation system; a using patterning structure to endow the projection beam with a pattern in its cross-section; and projecting the patterned beam of radiation onto a target portion of the layer of radiation-sensitive material. Thereafter, when a surface of a component is contaminated to a certain degree, for example, with carbon containing materials, a cleaning method according to an embodiment of the invention for removing the contamination can be applied to at least a part of the radiation system comprising: generating an electric field in a part of the lithographic projection apparatus; providing cleaning particles near the contamination by means of said electric field and removing at least a part of said contamination via interaction of the cleaning particles with the contamination. The cleaning method can also be applied before providing the substrate or before providing the projection beam. Thereby, the manufacturing is started with clean surfaces and, if the cleaning is applied to optical components, a large degree of accuracy in the projection beam is obtained.

Furthermore, a method or system according to an embodiment of the invention can be performed in-situ, that is without removing the component to be cleaned from its position.

It should be noted that the above-mentioned embodiments illustrate rather than limit the invention, and that those skilled in the art will be able to design alternatives without departing from the scope of the appended claims. In the claims, any reference signs placed between parentheses shall not be construed as limiting the claim. The word 'comprising' does not exclude the presence of other elements or steps than those listed in a claim. The mere fact that certain measures are recited in mutually different claims does not indicate that a combination of these measures cannot be used to advantage.

What is claimed is:

1. A cleaning system for removing contamination from at least a part of a surface of a component in a lithographic projection apparatus, the cleaning system comprising:
   an electric field generator that generates an electric field to provide cleaning particles near said surface of said component; and
   a contamination adjuster, communicatively connected to the electric field generator, that adjusts at least one property of the electric field in relation to at least one property of the contamination to be removed.

2. A cleaning system as claimed in claim 1, further comprising:
   a cleaning particle adjuster, communicatively connected to the electric field generator, that adjusts at least one property of the electric field in relation to at least one property of cleaning particles to be provided.

3. A cleaning system as claimed in claim 2, wherein the cleaning particle adjuster comprises a structure that adjusts at least one property of the cleaning particles to be provided and/or the electric field in relation to the at least one property of the contamination to be removed.

4. A cleaning system as claimed in claim 1, wherein the electric field generator comprises a controller that keeps the electric field substantially constant in time.

5. A cleaning system as claimed in claim 1, wherein the electric field generator comprises a structure that varies the electric field over time.

6. A cleaning system as claimed in claim 2, wherein the electric field generator comprises a pulse field generator that generates a pulsed electric field, and wherein the cleaning particle adjuster is communicatively connected to the pulse generator that controls the pulse width of the pulsed electric field in relation to at least one property of the cleaning particles to be provided.

7. A cleaning system as claimed in claim 1, wherein the cleaning particles to be provided comprise at least one of the group consisting of charge carriers accelerated by the electric field and particles generated by accelerated charge carriers, wherein said charge carriers comprise at least one of the group consisting of charged particles induced by electromagnetic radiation, electrons, ions, chemically reactive charge carriers, and chemically inert charge carriers, and wherein said particles generated by accelerated charge carriers comprise reactive particles.

8. A cleaning system as claimed in claim 7, wherein said electromagnetic radiation comprises Deep Ultra Violet or Extreme Ultra Violet radiation.

9. A cleaning system as claimed in claim 7, wherein said electrons comprise secondary electrons emitted from the surface of the component or electrons generated by creating ions.

10. A cleaning system as claimed in claim 7, wherein said chemically inert charge carriers comprise noble gas ions.

11. A cleaning system as claimed in claim 7, wherein said reactive particles comprises reactive ions or free radicals.

12. A cleaning system as claimed in claim 1, further comprising at least one magnetic field generator that generates a magnetic field to control the cleaning particles.

13. A cleaning system as claimed in claim 1, further comprising at least one gas supply that provides at least one gas in the electric field.

14. A cleaning system as claimed in claim 13, wherein said gas is one of oxygen and hydrogen, and wherein reactive ions, generated from said gas, are accelerated towards the surface by the electric field.

15. A cleaning system as claimed in claim 1, wherein the electric field generator comprises at least one electrode, and the cleaning system further comprises a mechanical actuator that changes a position of at least one of the at least one electrode with respect to the surface.

16. A cleaning system as claimed in claim 15, wherein the mechanical actuator is configured to adjust a distance between the electrode and the surface.

17. A cleaning system as claimed in claim 1, wherein the electric field generator comprises at least one electrode with an adjustable geometry.

18. A cleaning system as claimed in claim 1, wherein the electric field generator comprises at least one electrode having a surface of a material which is substantially similar to the material of the surface of the component.

19. A cleaning system as claimed in claim 1, wherein the electric field generator comprises a reverse mechanism that reverses the electric field.

20. A cleaning system as claimed in claim 1, further comprising a radiation system that projects electromagnetic radiation on at least a part of the surface of the component.

21. A cleaning system as claimed in claim 20, wherein the electromagnetic radiation comprises Deep Ultra Violet or Extreme Ultra Violet radiation.

22. A cleaning system as claimed in claim 20, further comprising a reticle structured and arranged to modify the radiation beam profile reflected, or transmitted by said reticle such, that at least one of a beam intensity, beam direction, beam polarization, and beam cross-section are adapted to a location of the contamination, the thickness of the layer of contamination and/or the type of contamination to be removed from the surface of the component.

23. A cleaning system as claimed in claim 20, further comprising a dedicated cleaning mask that is configured to direct and control the electromagnetic radiation at the surface of the component to be cleaned.

24. A method for removing contamination from at least a part of a surface of a component of a lithographic projection apparatus, the method comprising:
generating an electric field in at least a part of the lithographic projection apparatus;
providing cleaning particles near said contamination with said electric field;
adjusting at least one property of the electric field in relation to at least one property of the contamination to be removed; and
removing at least a part of said contamination via interaction of said cleaning particles with said contamination.

25. A method as claimed in claim 24, further comprising projecting electromagnetic radiation on at least a part of the surface of the component.

26. A method as claimed in claim 25, wherein said electromagnetic radiation comprises Deep Ultra Violet or Extreme Ultra Violet radiation.

27. A method as claimed in claim 24, further comprising:
removing a first part of said contamination; and
removing at least a second part of said contamination, which second removing differs in at least one aspect from the first removing.

28. A device manufacturing method comprising:
removing contamination from at least a part of a surface of a component of a lithographic projection apparatus, wherein said removing contamination comprises
generating an electric field in at least a part of the lithographic projection apparatus,
providing cleaning particles near said contamination with said electric field, and
removing at least a part of said contamination via interaction of said cleaning particles with said contamination;
providing a beam of radiation;
using a patterning structure to endow the beam of radiation with a pattern in its cross-section; and
projecting the patterned beam of radiation onto a target portion of a substrate.

29. A lithographic projection apparatus comprising:
a radiation system that provides a beam of radiation;
a support structure that supports a patterning structure, the patterning structure configured to pattern the beam of radiation according to a desired pattern;
a substrate support that supports a substrate;
a projection system that projects the patterned beam onto a target portion of the substrate; and
an electric field generator that provides cleaning particles to a surface of a component of the apparatus to remove contamination from said surface.

30. A device manufacturing method comprising:
removing contamination from at least a part of a surface of a component of a lithographic projection apparatus, wherein said removing contamination comprises
generating an electric field in at least a part of the lithographic projection apparatus,
providing cleaning particles near said contamination with said electric field,
adjusting at least one property of the electric field in relation to at least one property of the contamination to be removed, and
removing at least a part of said contamination via interaction of said cleaning particles with said contamination;
providing a beam of radiation;
using a patterning structure to endow the beam of radiation with a pattern in its cross-section; and
projecting the patterned beam of radiation onto a target portion of a substrate.

31. A lithographic projection apparatus comprising:
a radiation system that provides a beam of radiation;
a support structure that supports a patterning structure, the patterning structure configured to pattern the beam of radiation according to a desired pattern;
a substrate support that supports a substrate;
a projection system that projects the patterned beam onto a target portion of the substrate;
an electric field generator that provides cleaning particles to a surface of a component of the apparatus to remove contamination from said surface; and
a contamination adjuster, communicatively connected to the electric field generator, that adjusts at least one property of the electric field in relation to at least one property of the contamination to be removed.

* * * * *